United States Patent
Yagi et al.

(10) Patent No.: US 7,569,124 B2
(45) Date of Patent: Aug. 4, 2009

(54) ANODIC OXIDATION APPARATUS

(75) Inventors: Yasushi Yagi, Kanagawa-ken (JP); Mitsuru Ushijima, Tokyo (JP); Yoshifumi Watabe, Kadoma (JP); Takuya Komoda, Kadoma (JP); Koichi Aizawa, Kadoma (JP)

(73) Assignee: Tokyo Electron Limited and Matsushita Electric Works, Ltd. (JP)

( * ) Notice: Subject to any disclaimer, the term of this patent is extended or adjusted under 35 U.S.C. 154(b) by 859 days.

(21) Appl. No.: 10/924,830

(22) Filed: Aug. 25, 2004

(65) Prior Publication Data

US 2005/0077183 A1 Apr. 14, 2005

(30) Foreign Application Priority Data

Aug. 27, 2003 (JP) .............. P2003-209091

(51) Int. Cl.
C25D 17/00 (2006.01)
C25D 11/02 (2006.01)

(52) U.S. Cl. ............ 204/230.2; 204/223; 204/DIG. 7

(58) Field of Classification Search .......... 204/230.2, 204/223, DIG. 7
See application file for complete search history.

(56) References Cited

U.S. PATENT DOCUMENTS

| 7,169,283 B2 * | 1/2007 | Yagi et al. ............ 205/91 |
| 2004/0089552 A1 | 5/2004 | Yagi et al. | |

FOREIGN PATENT DOCUMENTS

| JP | 2000-100316 | 4/2000 |
| JP | 2000-164115 | 6/2000 |
| JP | A-2003-213495 | 7/2003 |

* cited by examiner

Primary Examiner—Arun S Phasge
(74) Attorney, Agent, or Firm—Finnegan, Henderson, Farabow, Garrett & Dunner, LLP

(57) ABSTRACT

In an anodic oxidation apparatus and an anodic oxidation method and a panel for a display device manufactured by them, a large target substrate is treated by a smaller component. The anodic oxidation apparatus includes a lamp which emits light; a treatment bath which has a stage capable of mounting a target substrate thereon with a treatment part thereof directed upward and is provided at a position where the emitted light reaches and a frame located on the stage; a cathode electrode which is provided on the way of the emitted light to reach the mounted target substrate and includes an opening to allow the light to pass therethrough; a seal member which establishes a liquid sealing property between the frame and the mounted target substrate; a conductive contact member which is provided to be contactable with a plurality of electrode patterns formed on the target substrate outside an annular shape of the seal member and moves along side of the target substrate; and a current source which is electrically connected to the contact member and sets an output current value in accordance with the number of electrode patterns of the mounted target substrate in contact as the contact member moves.

7 Claims, 7 Drawing Sheets

ANODIC OXIDATION APPARATUS

CROSSREFERENCE TO RELATED APPLICATIONS

This application is based upon and claims the benefit of priority from the prior Japanese Patent Application No. 2003-209091, filed on Aug. 27, 2003; the entire contents of which are incorporated herein by reference.

BACKGROUND

1. Field of the Invention

The present invention relates to an anodic oxidation apparatus and an anodic oxidation method which anodize a target substrate to give electrochemical treatment to the substrate and a panel for a display device manufactured by these apparatus and method and, more particularly, to an anodic oxidation apparatus and an anodic oxidation method suitable to perform treatment for a large target substrate and a panel for a display device manufactured by these apparatus and method.

2. Description of the Related Art

Electrochemical anodic oxidation treatment of a target substrate is in use on various scenes. Such anodic oxidation includes treatment in which a polycrystalline silicon layer is made porous. The outline thereof is such that the target substrate having the polycrystalline silicon layer formed on the surface thereof is electrically connected to a positive potential pole of a power supply via a conductor and immersed in a hydrofluoric acid solution dissolved in a solvent (for example, ethyl alcohol). An electrode made of, for example, platinum is immersed in the hydrofluoric acid solution, in other words, in a chemical, and is electrically connected to a negative potential pole of the above-mentioned power supply. Further, the polycrystalline silicon layer on the target substrate immersed in the chemical is irradiated with light by a lamp.

This causes the polycrystalline silicon layer to partly melt in the hydrofluoric acid solution. Pores are formed where the polycrystalline silicon layer has been melted, so that the silicon layer is turned into a porous structure. The light irradiation by the lamp is intended for producing holes necessary for the reaction of the above-mentioned melting and pore formation in the polycrystalline silicon layer. For reference, such reaction in the polycrystalline silicon layer in the anodic oxidation is explained, for example, as follows.

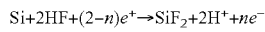

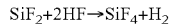

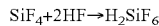

Here, $e^+$ is a hole and $e^-$ is an electron. Therefore, this reaction requires holes as a precondition and is different from simple electrolytic polishing.

The porous silicon thus produced is made suitable as a highly efficient field emission electron source by further forming a silicon oxide layer on a nano-level surface thereof, which is disclosed in, for example, Japanese Patent Laid-open Application No. 2000-164115, Japanese Patent Laid-open Application No. 2000-100316, and so on. The use of such a porous silicon as the field emission electron source has been drawing attention as opening a door to realizing a new flat display device.

In the anodic oxidation treatment as described above, the value of electric current passing from a target substrate to a cathode electrode via a chemical is proportional to the area of the target substrate (the area of a treatment part). This is because the electric current causes the reaction to proceed, and the reaction evenly occurs at every point within the target substrate. Therefore, when the target substrate has a large area directed for a large display device, the current value required for treatment increases prominently. For example, assuming that a treatment current of about 5A is necessary for a target substrate having a size of 200 mm square, it is necessary to pass through a target substrate having a size of 1000 mm square a current of 125A that is 25 times the aforementioned treatment current. Note that the area equal to 1000 mm square is a numerical value naturally conceivable from future trends of the large display device.

A device which passes such a large electric current necessarily requires a current source and so on which are larger, resulting in an expensive device. Further, the area which a light source irradiates with light also increases, and the cathode electrode is increased in shape, also resulting in a cause to push up the cost of the device. This is also reflected on the manufacturing cost of a substrate which will be manufactured by this device.

Further, different viewpoints reveal such an aspect that the increase in area for the light source to irradiate with light makes it difficult to irradiate the target substrate with a uniform light amount and the larger cathode electrode makes it difficult to secure uniformity in electric field formed between the cathode electrode and the target substrate, thereby deteriorating the uniformity in the anodic oxidation within the target substrate. This is a problem in terms of ensuring of the quality of the substrate to be manufactured.

SUMMARY

The present invention is made in consideration of the above-mentioned circumstances, and an object thereof is to provide an anodic oxidation apparatus and an anodic oxidation method which anodize a target substrate to give electrochemical treatment to the substrate and a panel for a display device manufacture by these apparatus and method in which a large target substrate can be treated by a smaller component.

In order to solve the above-described problems, an anodic oxidation apparatus according to the present invention is characterized by including: a lamp which emits light; a treatment bath which has a stage capable of mounting a target substrate thereon with a treatment part directed upward and is provided at a position where the emitted light reaches and a frame located on the stage; a cathode electrode which is provided on the way of the emitted light to reach the mounted target substrate and includes an opening to allow the light to pass therethrough; a seal member which establishes a liquid sealing property between the frame and the mounted target substrate; a conductive contact member which is provided to be contactable with a plurality of electrode patterns formed on the target substrate outside an annular shape of the seal member and moves along side of the mounted target substrate; and a current source which is electrically connected to the contact member and sets an output current value in accordance with the number of electrode patterns of the mounted target substrate in contact as the contact member moves.

More specifically, this anodic oxidation apparatus has the contact member which moves along the side of the target substrate, so that passage of electric current for anodic oxidation is performed for the target substrate on a part-by-part basis. Therefore, the electric current required for the treatment can be reduced, so that a large target substrate can be treated by a small component. Here, the current source for passing electric current sets the output current value in accordance with the number of electrode patterns of the mounted target substrate in contact as the contact member moves. This is for maintaining the electric current to be passed through, for example, each electrode pattern fixed to thereby uniformize the anodic oxidation treatment on the target substrate irrespective of locations.

Further, an anodic oxidation method according to the present invention is characterized by including: mounting a target substrate on a stage with a treatment part thereof directed upward; locating a frame on the target substrate with the mounted target substrate used as a bottom part to form a treatment bath such that a liquid sealing property is established between the frame and the mounted target substrate; introducing a chemical into the formed treatment bath and locating a cathode electrode in the introduced chemical; and bringing a contact member into contact with a portion of a plurality of electrode patterns formed on the target substrate outside the frame, and irradiating the treatment part of the target substrate in contact with the chemical with light while supplying a driving current between the portion of the electrode patterns and the cathode electrode, wherein the irradiating with light while supplying a driving current is performed while moving the contact member and setting an output current value of the supply of the driving current in accordance with the number of electrode patterns of the target substrate which are in contact with the contact member due to the movement.

More specifically, this anodic oxidation method performs treatment by moving the contact member to bring them into contact with, on a portion-by-portion basis, the electrode patterns formed on the target substrate. Therefore, the electric current required for the treatment can be reduced, so that a large target substrate can be treated by a small component. Here, the driving for passing the electric current is performed while the output current value is set in accordance with the number of electrode patterns of the target substrate in contact as the contact member moves. This is for maintaining the electric current to be passed through, for example, each electrode pattern fixed to thereby uniformize the anodic oxidation treatment on the target substrate irrespective of locations.

Further, a panel for a display device according to the present invention is characterized by including: a substrate; a plurality of electrode patterns formed on the substrate which corresponds to scanning lines; and a porous silicon layer formed over the electrode patterns in which degrees of pore formation at parts near an upper and a lower side of the substrate are different from a degree of pore formation at a part sandwiched between the parts near the upper and lower sides.

There can be a case as an example of such a panel for a display device in which the degrees of the pore formation at parts near the upper and lower sides of the substrate are higher on one side and lower on the other side than that of the part on the substrate sandwiched therebretween. There can be a case as another example in which the degrees of the pore formation near both the upper and lower sides of the substrate are lower than that of the part on the substrate sandwiched therebretween.

The former can occur when the pore formation treatment is performed by moving the contact member in a manner to bring them into contact with, on a portion-by-portion basis, electrode patterns formed on the substrate, and when the polycrystalline silicon layer before the pore formation is very thin. This is because even though the treatment current is controlled in accordance with the number of electrode patterns in contact, timings of starting treatment are different at positions of the electrode patterns in the originally thin silicon layer, and the reaction result at the electrode position where the treatment has already further proceeded generates a stronger electric field to thereby cause the reaction to proceed further. This causes the pore formation to proceed further at a part near the beginning of movement of the contact member and to be restrained more greatly at a part near the end of movement.

The latter can occur when the anodic oxidation is performed for a substrate which is provided with dummy electrode patterns near the upper and lower sides thereof by bringing the whole area of the contact member into contact with electrode patterns on a portion-by-portion basis. When such dummy electrode patterns are provided, the number of electrode patterns in contact with the contact member is substantially constant irrespective of the movement positions of the contact member. Accordingly, there is an advantage that little or no current control over time is necessary. The reason why the degrees of pore formation are small at the parts near the upper and lower sides of the substrate is that the cumulative amount of anodic oxidation treatment is relatively small. In this case, the substrate can be used in a panel for a display device with a part having the lower degree of pore formation located outside the effective area as the display device.

The above-described panel for a display device can be manufactured by the above-described anodic oxidation apparatus and anodic oxidation method. When manufacturing the latter panel for a display device, the number of electrode patterns of the target substrate in contact with the contact member due to the movement of the contact member becomes substantially constant, mentioned again, because of the dummy electrode patterns provided.

DETAILED DESCRIPTION

Figure 1A:
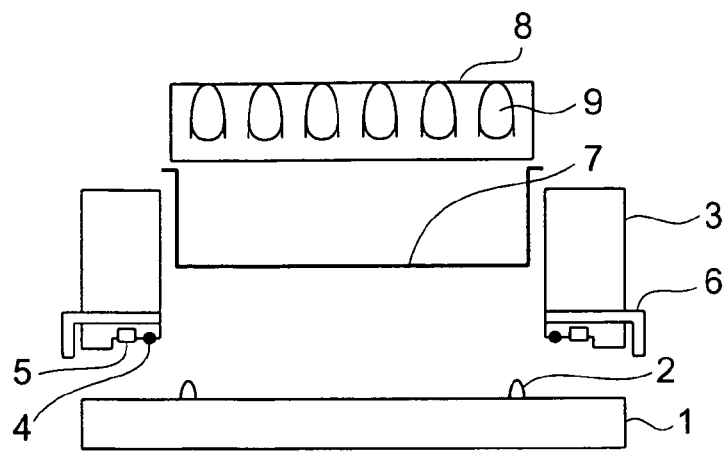
FIG. 1A, FIG. 1B, and FIG. 1C are views schematically showing vertical cross sections of a basic configuration of an anodic oxidation apparatus according to an embodiment of the present invention.

As an aspect of the present invention, a length of the contact member to be provided for contact with the electrode patterns of the target substrate in a direction of the movement thereof ranges from 10 mm to 200 mm. When the length is short, the value of electric current required to be passed is small but the treatment time as a whole target substrate increases. When it is long, the current value conversely increases but the treatment time can be reduced. In consideration of the size of the actual target substrate, a design value ranging from 10 mm to 200 mm is suitable. Within that range, it can be considered as actually preferable to set the value within a range from 50 mm to 100 mm.

Further, as an aspect of the present invention, the contact members move while in contact with the electrode patterns of the target substrate by sliding thereon. This is one example in which the contact members are moved while they are in contact with the electrode patterns. This simplifies the configuration as the contact members without the need of a mechanical portion.

Further, as an aspect of the present invention, the contact members move while in contact with the electrode patterns of the target substrate by rolling thereon. This is another example in which the contact members are moved while they are in contact with the electrode patterns. This is advantageous in terms of life because the contact members are brought into contact by rolling and thus suffer less wear.

Further the anodic oxidation apparatus as an aspect of the present invention further includes a moving/scanning part which moves in synchronism with the movement of the contact members the lamp and the cathode electrode. The local provision of the lamp and the cathode electrode leads to a reduction in cost required for them. In this arrangement, the locally provided lamp and cathode electrode are moved to perform treatment.

Further, as an aspect of the present invention, the current source outputs electric current proportional to the number of the electrode patterns of the target substrate which are in contact with the contact members. This is typical output of electric current. If the number of the electrode patterns in contact at a time is large, it is possible to neglect an increase or decrease in the contact number by one accompanying to the movement of the contact members. In this case, the current output is "substantially proportional" to the number.

Further, the anodic oxidation apparatus as an aspect of the present invention further includes a contact member moving/scanning part which moves the contact members at a fixed speed. The movement of the contact members at a fixed speed facilitates the control of the driving current. Further, a higher uniformity in treatment over the target substrate can be obtained more easily.

It should be noted that the above aspects are substantially similarly applicable, as a principle, also as aspects of the present invention as an anodic oxidation method.

Figure 1B:
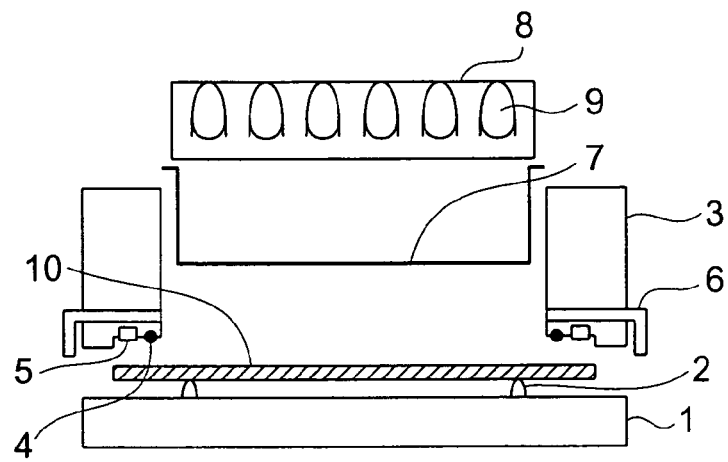
Figure 1C:
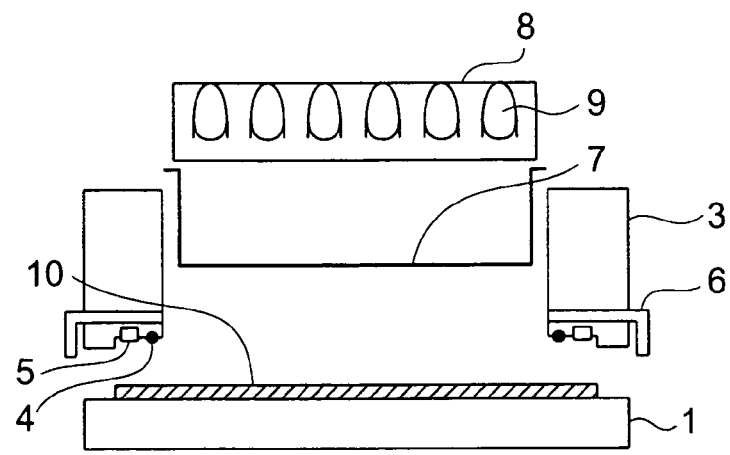
Figure 2A:
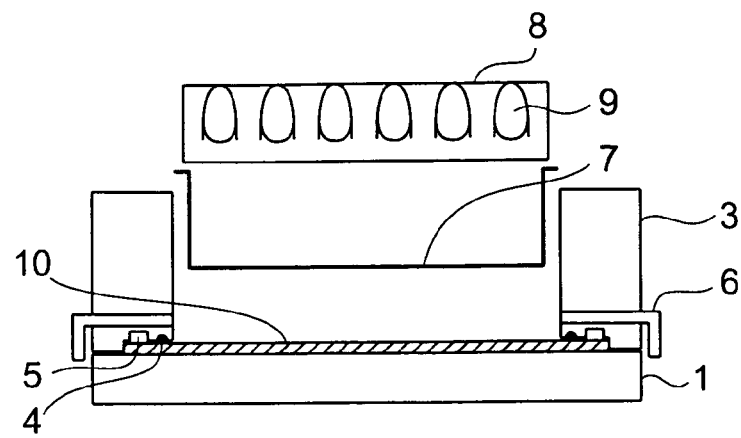
FIG. 2A, FIG. 2B, and FIG. 2C are views, subsequent to FIG. 1A, FIG. 1B, and FIG. 1C, schematically showing vertical cross sections of the basic configuration of the anodic oxidation apparatus according to the embodiment of the present invention.
Figure 2B:
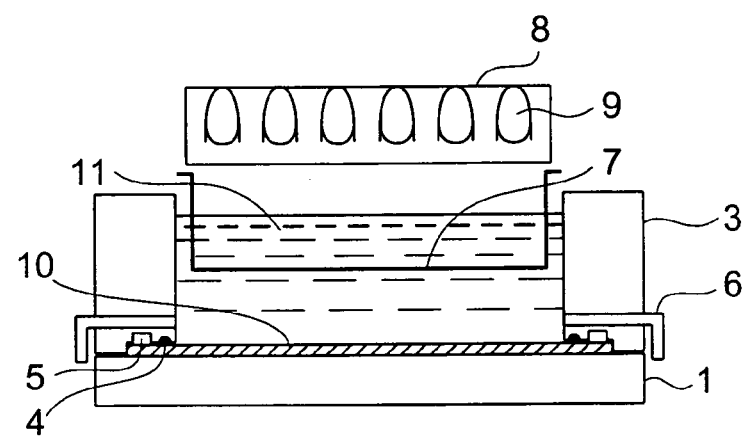
Figure 2C:
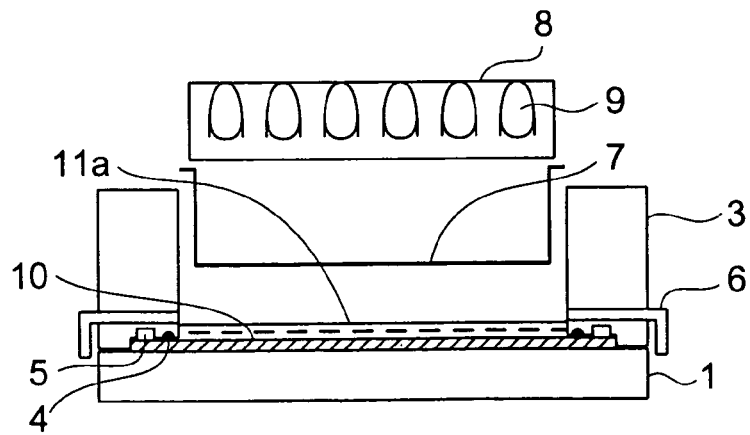

Based on the above situation, embodiments of the present invention will be described below with reference to the drawings. FIG. 1A, FIG. 1B, and FIG. 1C are views showing schematic vertical cross sections of a basic configuration of an anodic oxidation apparatus according to an embodiment of the present invention, and illustrating the anodic oxidation apparatus operating in the order from FIG. 1A to FIG. 1C. FIG. 2A, FIG. 2B, and FIG. 2C are views, subsequent to FIG. 1A, FIG. 1B, and FIG. 1C, similarly showing the anodic oxidation apparatus operating in the order from FIG. 2A to FIG. 2C.

As shown in FIG. 1A, this anodic oxidation apparatus includes a stage 1, a substrate lifter 2 provided on the stage 1, a frame 3, a seal member 4 and contact members 5 which are provided on the frame 3, a chemical solution supply/discharge port 6 extending through the frame 3, a cathode electrode 7, a lamp unit 8, and lamps 9 provided in the lamp unit 8.

The stage 1 is a table capable of mounting a target substrate thereon with a treatment part of the substrate directed upward and provided with the substrate lifter 2 to smoothly deliver and take out the target substrate. The substrate lifter 2 is provided on an upper face of the stage 1 to be able to protrude therefrom/retract thereinto, so that it protrudes from the upper face of the stage 1 when delivering the target substrate onto the stage 1 and taking it out of the stage 1. The substrate lifter 2 thus protruded creates a clearance between the upper face of the stage 1 and the target substrate, thus allowing, for example, an arm robot having a fork which horizontally supports the target substrate to be smoothly used when delivering and taking out the target substrate to/from the stage 1.

The frame 3 has an opposed face to a peripheral part of the target substrate mounted on the stage 1 and has a cylindrical shape having an opening for allowing the treatment part of the target substrate to be exposed upward. In the state shown in FIG. 1A, the frame 3 has a clearance with respect to the stage 1 but is relatively lowered with respect to the target substrate by a not-shown vertical movement mechanism when the target substrate is mounted on the stage 1. The use of "relatively" here is intended to show the possibility of elevation of the stage 1 side.

When the frame 3 is relatively lowered with respect to the target substrate, the seal member 4 annularly provided on a bottom face of the frame 3 is brought into contact with the target substrate into crush, thereby establishing a liquid sealing property. In other words, a treatment bath using the treatment part of the target substrate as its bottom face can be formed inside the frame 3.

Outside the annular shape of the seal member 4, the contact members 5 which are conductive are provided. The contact members 5 are in electrical contact, in a dry state, with electrode patterns provided on the peripheral part of the target substrate as well as establishing the aforementioned sealing property, and maintains this state through use of the seal member 4 even after a chemical is filled in the treatment bath. The contact members 5 are also movable along sides of the target substrate such that electrode patterns in contact therewith are shifted due to their movement. The movement of the contact members will be described later in more detail.

Moreover, the chemical supply/discharge port 6 is provided to extend through a wall of the frame 3. Once the treatment bath is formed inside the frame 3 using the treatment part of the target substrate as its bottom face as described above, the chemical for use in anodic oxidation can be supplied from the chemical supply/discharge port. A sufficient amount of the chemical is supplied into the frame 3 such that a horizontal part of the cathode electrode 7 is immersed completely in the chemical.

The cathode electrode 7 is supported on a supporter (not shown) such that its vertical position is unchangeable relative to the frame 3. The cathode electrode 7 has a shape of a plane opposed substantially parallel to the treatment part of the target substrate, and includes openings for allowing light from the lamps 9 to pass therethrough and a conductive part made of a material capable of functioning as an electrode. The conductive part is formed, for example, in a lattice shape. In an actual anodic oxidation treatment, a driving current is supplied between the cathode electrode 7 and the contact members 5 by a not-shown current source.

The lamp unit 8 includes a plurality of lamps 9 and is provided such that light emitted therefrom is directed to the target substrate mounted on the stage 1. The lamp unit 8 is supported on a supporter (not shown) such that its vertical position is unchangeable relative to the frame 3.

Operations of process for treating the target substrate by the anodic oxidation apparatus having the above-described configuration will be described using FIG. 1A to FIG. 1C and FIG. 2A to FIG. 2C.

First, the apparatus is brought into a state as shown in FIG. 1A (a state in which the substrate lifter 2 protrudes from the face of the stage 1 and there is a clearance between the frame 3 and the stage 1), thereby establishing a state capable of receiving a target substrate. Then, for example, the arm robot having a fork carries a target substrate 10 through the clearance between the frame 3 and the stage 1 to deliver it onto the substrate lifter 2 as shown in FIG. 1B.

Next, as shown in FIG. 1C, the substrate lifter 2 is retracted into the stage 1 to thereby mount and hold the target substrate 10 on the stage 1. After the target substrate 10 is mounted and held on the stage 1, the frame 3 (and the cathode electrode 7 and the lamp unit 8) is lowered relative to the stage 1 to bring the seal member 4 into press contact with the target substrate 10 as shown in FIG. 2A. In this event, the contact members 5 are brought into contact with a portion of the electrode patterns provided on the peripheral part of the target substrate 10. Further, the treatment bath using the treatment part of the target substrate 10 as its bottom face is formed inside the frame 3.

Then, a chemical (for example, a hydrofluoric acid solution using ethyl alcohol as a solvent) 11 is introduced through the chemical supply/discharge port 6 into the treatment bath, which is filled with a sufficient amount of the chemical to immerse the cathode electrode 7 therein as shown in FIG. 2B. This resulting state enables actual anodic oxidation treatment. The anodic oxidation is implemented by supplying a driving current between the contact members 5 and the cathode electrode 7, moving the contact members 5 along the sides of the target substrate and lighting the lamps 9 for irradiation of the treatment part of the target substrate 10 with the light. The cumulative treatment time is set to a range from about several seconds to about several tens of seconds for each part of the target substrate.

After completion of the actual anodic oxidation treatment, the chemical 11 is discharged from the chemical supply/discharge port 6 as shown in FIG. 2C. Thereafter, for example, ethyl alcohol for a diluent may be introduced and discharged through the chemical supply/discharge port 6 a several times to thereby clean the inside of the treatment bath and the treatment part of the target substrate 10. The cleaning can be performed to a degree at which a solution level of a residual solution 11a exists over the target substrate 10 when discharging, thereby avoiding adverse effect by atmosphere on the treatment part.

Figure 3A:
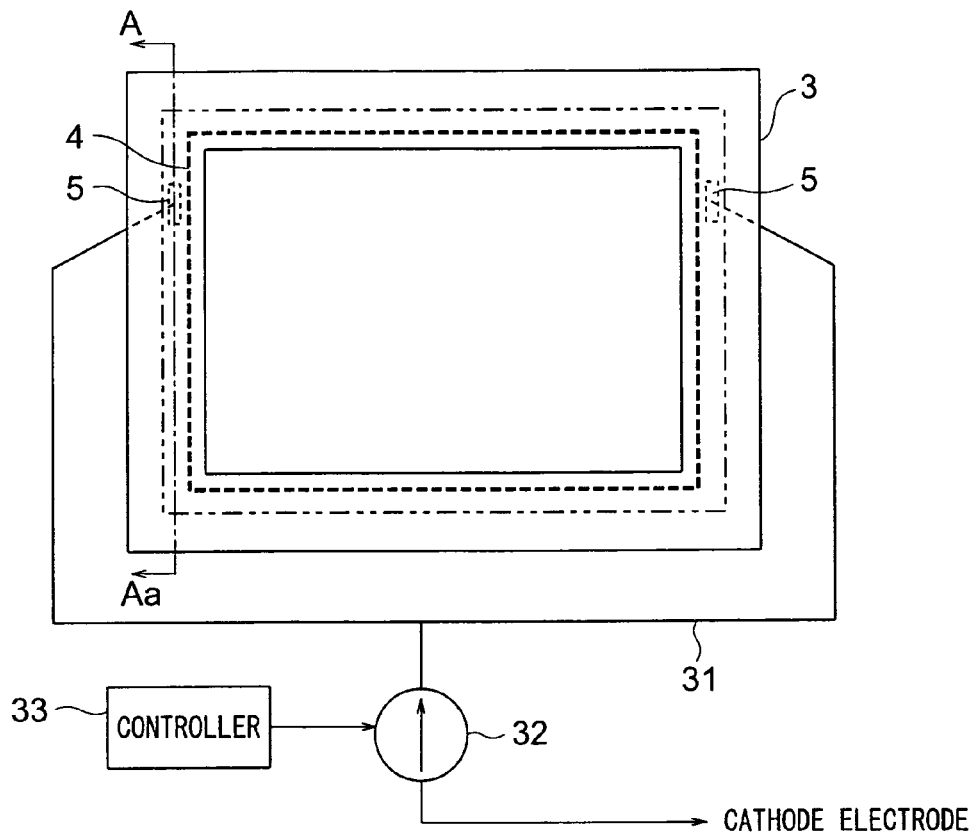
FIG. 3A and FIG. 3B are a plan view of a frame 3 shown in FIG. 1A to FIG. 1C, FIG. 2A to FIG. 2C and a view showing components connected to a contact member 5.
Figure 3B:
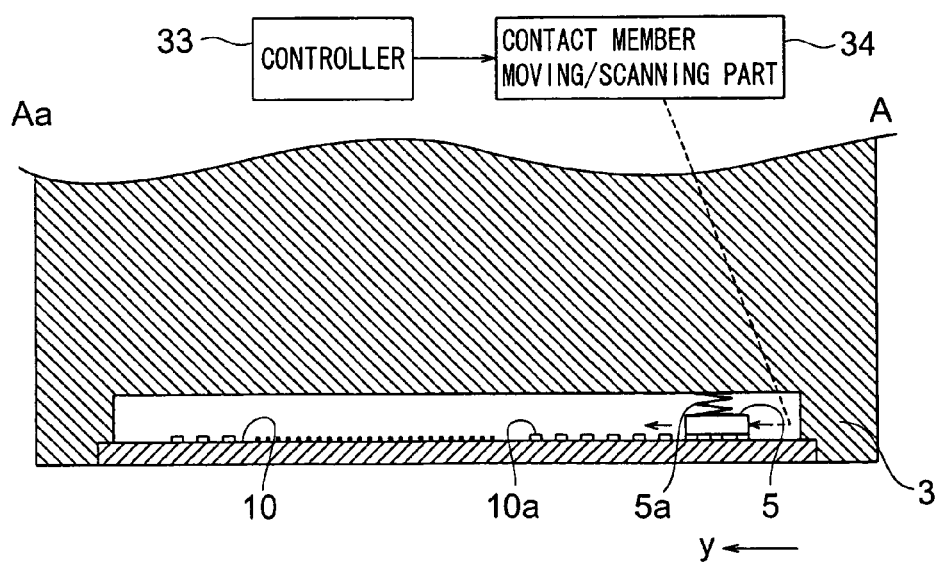

Next, the above-described configuration for moving the contact members 5 will be described in more detail with reference to FIG. 3A and FIG. 3B. FIG. 3A and FIG. 3B are a plan view of the frame 3 and a view showing components connected to the contact member 5, in which the same numerals are assigned to the components already described. Note that the illustration of the chemical supply/discharge port 6 is omitted for convenience of explanation.

As shown in the drawings, the seal member 4 is annularly provided on the bottom face of the frame 3 (the face opposed to the target substrate), and the contact members 5 are provided outside the annular shape. Note that the frame shown by a two-dotted chain line shows a position where the target substrate 10 should be located. The contact members 5 which are opposed to each other to form a pair are electrically connected with a conducting wire 31 and connected to a positive pole side of a current source 32. A negative pole side of the current source 32 is connected to the cathode electrode which is not shown in the drawings. The current source 32 is controlled by a controller 33, and a processing apparatus comprising hardware such as a CPU (central processing unit) and software such as basic software and application programs can be used for the controller 33.

Further, the contact member 5 moves perpendicular (in a y-direction) to a direction of electrode patterns 10a which are individually formed on the target substrate 10 as shown in FIG. 3B that shows a cross section taken along an arrow A-Aa in the plan view shown in FIG. 3A. The number of the illustrated electrode patterns 10a with which the contact member 5 comes into contact at a time is three (possibly two depending on its movement) in this drawing for simplification of description.

The actual number depends on the actual dimensions of the target substrate 10, the placement density of the electrode patterns 10a, and the length in a traveling direction of the contact member 5. For example, to schematically illustrate a typical case, the actual number is 75 assuming that the length in the y-direction of the target substrate 10 is about 1000 mm, the number of the electrode patterns 10a is about 1000 corresponding to scanning lines, and the length in the traveling direction of the contact member 5 is 75 mm. The length in the traveling direction of the contact member 5 is preferably set to a range from about 10 mm to about 200 mm from the reason already described, more actually from about 50 mm to about 100 mm.

Note that the contact member 5 may be pressed against the electrode patterns 10a by a pressing member 5a such as a spring as shown in the drawing to maintain its electrical contact. In this embodiment, at least a bottom face of the contact member 5 is made of a conductive material, and the contact member 5 moves on the target substrate 10 by sliding (accordingly its contact state with the electrode patterns 10a shifts by the sliding). Further, a linear moving mechanism (for example, a linear motor) as well known can be used as a contact member moving/scanning part 34 for moving the contact member 5 in the y-direction. The contact member moving/scanning part 34 is controlled by the above-described controller 33.

Figure 4A:
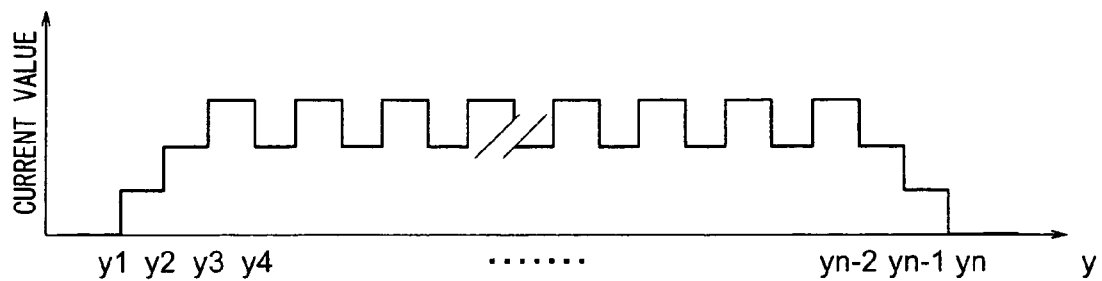
FIG. 4A and FIG. 4B are diagrams for explaining shift of an output current value of a current source 32 shown in FIG. 3A and FIG. 3B.
Figure 4B:
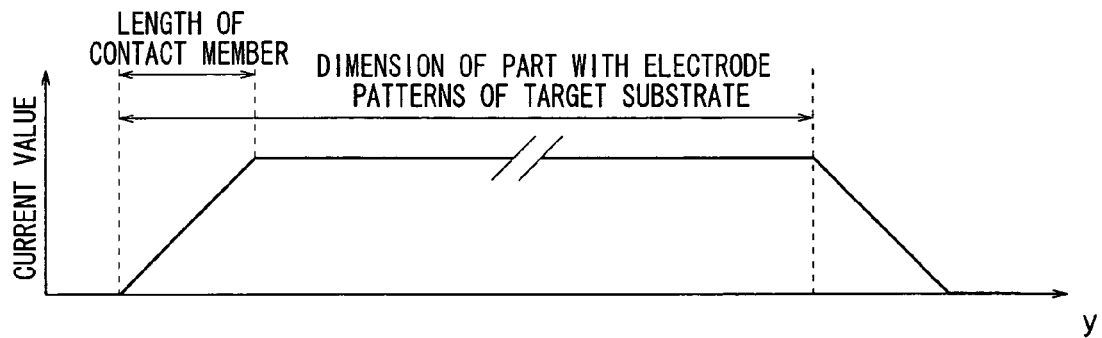

FIG. 4A and FIG. 4B are diagrams for explaining shift of an output current value of the current source 32. In FIG. 4A and FIG. 4B, the horizontal axis represents the position in the y-direction of the contact member 5. In the above-described case where the number of the electrode patterns 10a with which the contact member 5 comes into contact at a time is a maximum of three, the output current value is shifted by the controller 33 as shown in FIG. 4A. In other words, when the contact member 5 is at a waiting position near a corner of the target substrate 10 (before a position of y1), the contact member 5 is in contact with no electrode pattern 10a, resulting in an output current value of 0.

The contact member 5 is then moved at a fixed speed in the y-direction to allow output of electric current corresponding to one electrode pattern 10a at the position (y1) where the contact member 5 is first brought into contact with the electrode pattern 10*a*. The contact member 5 is then further moved to a position (y2) where it is brought into contact with two electrode patterns 10*a* to allow electric current corresponding to two electrode patterns 10*a* such that the aforementioned electric current corresponding to one electrode pattern 10*a* passes through each of them. The contact member 5 is then further moved to a position (y3) where it is brought into contact with three electrode patterns 10*a* to allow output of electric current corresponding to the three electrode patterns 10*a* such that the aforementioned electric current corresponding to one electrode pattern 10*a* passes through each of them.

When the contact member 5 is moving from the waiting position as described above, the current source 32 is made to gradually increase its output current in accordance with the number of the electrode patterns 10*a*. After the entire contact member 5 in the length direction reaches the area where the electrode patterns 10*a* are formed (after the position of y3), the number of the electrode patterns 10*a* in contact is repeatedly changed between three and two depending on the position in the y-direction of the contact member 5, and therefore the output current of the current source 32 is controlled in response to this change. This situation continues to a position of yn−2.

After the position of yn−2, a part of the contact member 5 in the length direction falls outside the area where the electrode patterns 10*a* are formed, whereby the number of the electrode patterns 10*a* in contact decreases. Hence, in accordance with the decrease, the output current value of the current source 32 is decreased gradually. Note that the above-described contents are also applicable, on the same principle, to a case where the number of the electrode patterns 10*a* in contact with the contact member 5 at a time is larger than the above case.

When the above-described current control is performed, the current value passed through the electrode pattern 10*a* is fixed during the movement of the contact member 5, that is, the cumulative amount of charges passed per electrode pattern 10*a* is identical in terms of time. Accordingly, a polycrystalline silicon layer over the target substrate 10 corresponding to the area where the electrode patterns 10*a* are formed is made porous at the same degree.

Therefore, the whole area where the electrode patterns 10*a* are formed can be used as an effective area of a display device. Note that the movement of the contact member 5 is described as being at a fixed speed in the above description, but even when the speed is not fixed, similar results can be obtained as the target substrate 10 by controlling the output current value of the current source 32 such that the cumulative amount of charges passed per electrode pattern 10*a* is identical in terms of time.

Besides, when the number of the electrode patterns 10*a* with which the contact member 5 is brought into contact at a time is somewhat large, the profile of the output current value of the current source 32 can be simplified as a whole into an isosceles trapezoid as shown in FIG. 4B. In the profile of such an isosceles trapezoid, the length in the y-direction corresponding to a hypotenuse part corresponds to the length in the traveling direction of the contact member 5, and the average of an upper base and a lower base corresponds to the dimension in the y-direction of a part where the electrode patterns 10*a* lie of the target substrate 10.

In the above-described embodiment, since it is not necessary to pass electric current through all of the electrode patterns 10*a* at a time, the rated capacity of the current source 32 can be considerably reduced. Therefore, the electric current required for anodic oxidation treatment can be reduced, so that a large target substrate can be treated by a small component (specifically, the small current source 32). Furthermore, since the area on the target substrate 10 through which electric current is passed at a time is reduced, improved uniformity in electric current over the target substrate 10 can be expected. This enables increased uniformity in anodic oxidation.

Figure 5:
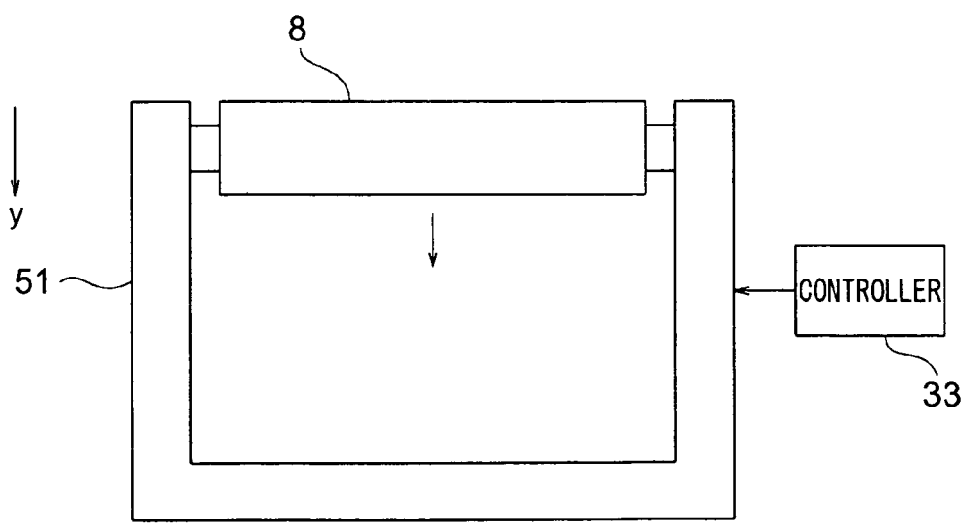
FIG. 5 is a plan view showing a configuration example which can be used as a lamp unit 8 shown in FIG. 1A to FIG. 1C and FIG. 2A to FIG. 2C.

Next, a configuration example of the lamp unit 8 shown in FIG. 1A to FIG. 1C and FIG. 2A to FIG. 2C will be described. FIG. 5 is a plan view showing a configuration example which can be used as the lamp unit 8 shown in FIG. 1A to FIG. 1C and FIG. 2A to FIG. 2C. This lamp unit 8 is configured to be shorter in the vertical direction in the drawing as having an elongated irradiation area, and hung on a lamp unit moving/scanning part 51 to be movable in the vertical direction in the drawing.

The movement of the lamp unit 8 is performed by the above-described controller 33 in response to a change of the part through which electric current is passed in the target substrate 10 to be irradiated. Accordingly, the light required for a part to be actually subjected to anodic oxidation on the target substrate 10 can be applied by a smaller lamp unit 8. Therefore, the lamps can be reduced in number, leading to a low price apparatus. Further, since the area to be irradiated is small in area, the nonuniformity in irradiation can be reduced to realize more uniform anodic oxidation. Note that it is advantageous that the movement of the lamp unit 8 by the lamp unit moving/scanning part 51 under control of the above-described controller 33 easily synchronizes with the movement of the contact members 5.

Figure 8:
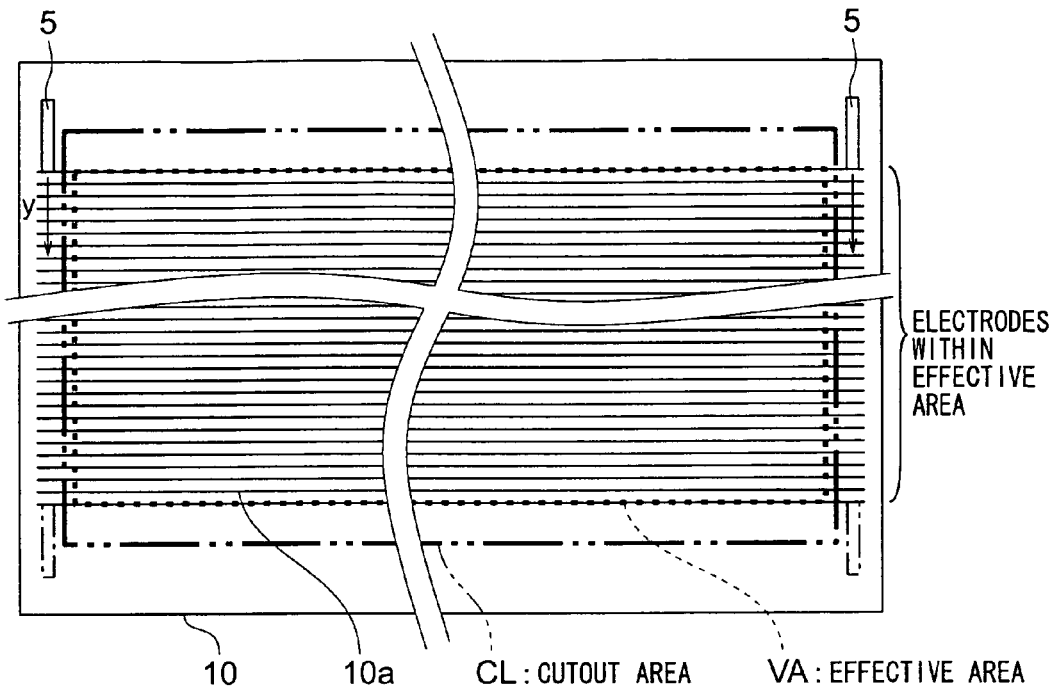
FIG. 8 is a view showing a positional relationship between electrode patterns of a target substrate and the contact member in an embodiment of the present invention.

Next, a configuration example of the cathode electrode 7 shown in FIG. 1A to FIG. 1C and FIG. 2A to FIG. 2C will be described. FIG. 8 is a plan view showing a configuration example which can be used as the cathode electrode 7 shown in FIG. 1A to FIG. 1C and FIG. 2A to FIG. 2C. This cathode electrode 7 is configured to be shorter in the vertical direction in the drawing and hung on a cathode electrode moving/scanning part 61 to be movable in the vertical direction in the drawing.

The movement of the cathode electrode 7 is performed by the above-described controller 33 in response to a change of the part through which current is passed in the target substrate 10. Therefore, the cathode electrode, which is opposed to the part to be actually subjected to anodic oxidation on the target substrate 10, can be realized by the smaller cathode electrode 7. Accordingly, the amount of expensive electrode material (for example, platinum) used can be reduced, leading to a low price apparatus. Further, the cathode electrode 7 opposed to the target substrate 10 is reduced in area, thereby possibly generating an electric field more uniform. This enables improved uniformity. Note that it is advantageous that the movement of the cathode electrode 7 by the cathode electrode moving/scanning part 61 under control of the above-described controller 33 easily synchronizes with the movement of the contact members 5.

Further, although the cathode electrode 7 is configured such as to be hung on the cathode electrode moving/scanning part 61 to be movable, the cathode electrode 7 may be configured to be hung on the lamp unit 8 illustrated with FIG. 5 to move together with the lamp unit 8.

Figure 6:
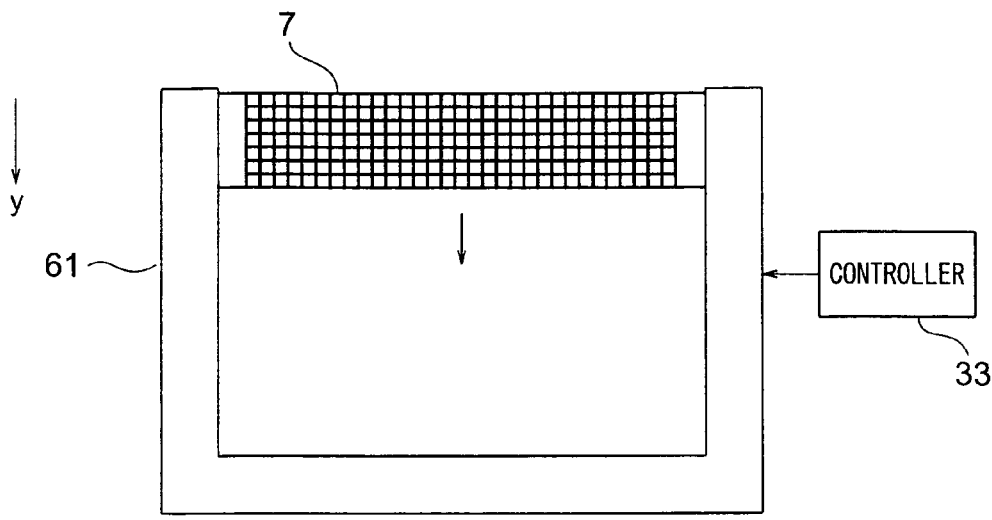
FIG. 6 is a plan view showing a configuration example which can be used as a cathode electrode 7 shown in FIG. 1A to FIG. 1C and FIG. 2A to FIG. 2C.

Further, the lamp unit moving/scanning part 51 and the cathode electrode moving/scanning part 61 shown in FIG. 5 and FIG. 6 respectively are mechanisms which move the lamp unit 8 and the cathode electrode 7 only in the vertical directions in the drawings, and in addition to these functions, other mechanisms having functions of moving them in directions perpendicular to the paper surfaces may be added. Such mechanisms allow the lamp unit 8 and the cathode electrode 7 to be located, separated at optimal distances from the target substrate 10.

Figure 7A:
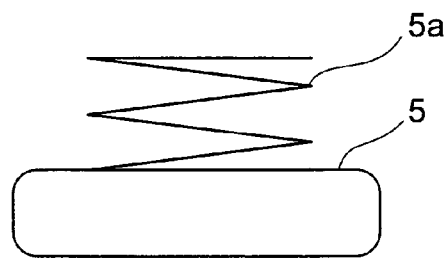
FIG. 7A and FIG. 7B are views showing in a little more detail a configuration example which can be used as the contact member shown in FIG. 1A to FIG. 1C, FIG. 2A to FIG. 2C, FIG. 3A, and FIG. 3B.
Figure 7B:
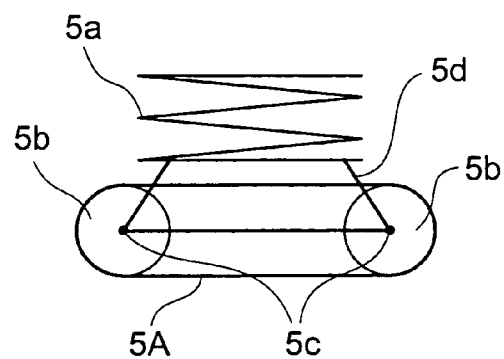

Next, the configuration of the contact member 5 will be further described with reference to FIG. 7A and FIG. 7B. FIG. 7A and FIG. 7B are views showing in a little more detail the configuration example which can be used as the contact members 5 shown in FIG. 1A to FIG. 1C, FIG. 2A to FIG. 2C, FIG. 3A, and FIG. 3B. What is shown in FIG. 7A is the same as already described. The bottom face of the contact member 5 is made a slide face, and the upper face thereof is provided with the press member 5a implemented by, for example, a spring. At least the bottom face of the contact member 5 is made of a conductive material to be able to keep in electrical contact with the electrode pattern 10a. As a matter of course, not only the bottom face but also the whole surface or the contact member 5 as a solid may be conductive. Such a contact member can easily be configured in terms of mechanism.

What is shown in FIG. 7B is an example of another contact member. This contact member 5A is a conductive material in a belt shape put around two wheels 5b, 5b. The wheels 5b, 5b are rotatably attached to rotary shafts 5c provided at both ends of the lower base of a frame 5d in a trapezoid shape as a side shape. On the upper side of the frame 5d, the press member 5a is provided. When such a contact member 5A is used, it is moved by rolling of the wheels 5b, 5b, thus realizing more smooth movement. Further, the contact member 5A is less susceptible to abrasion and therefore advantageous in terms of life.

FIG. 8 is a view showing the positional relationship between the electrode patterns of the target substrate and the contact members in an embodiment of the present invention described above (one described in relation to FIG. 3A, FIG. 3B, FIG. 4A, and FIG. 4B). More specifically, there is no contact between the contact members 5 and the electrode pattern 10a at the beginning of the movement and the end of the movement of the contact members 5. The control of the already-described current source 32 is performed as the contact members 5 are moved, whereby pore formation can be uniformly performed within a part of the target substrate where the electrode patterns exist (a part with electrodes within an effective area). A part where the pore formation is uniformly performed is used as an effective area VA of a display device as shown in the drawing. Cutting-out is performed such that a necessary area (such as an arrangement area for other electrodes) as the display device is left outside the effective area VA (a cutout area CL).

Figure 9:
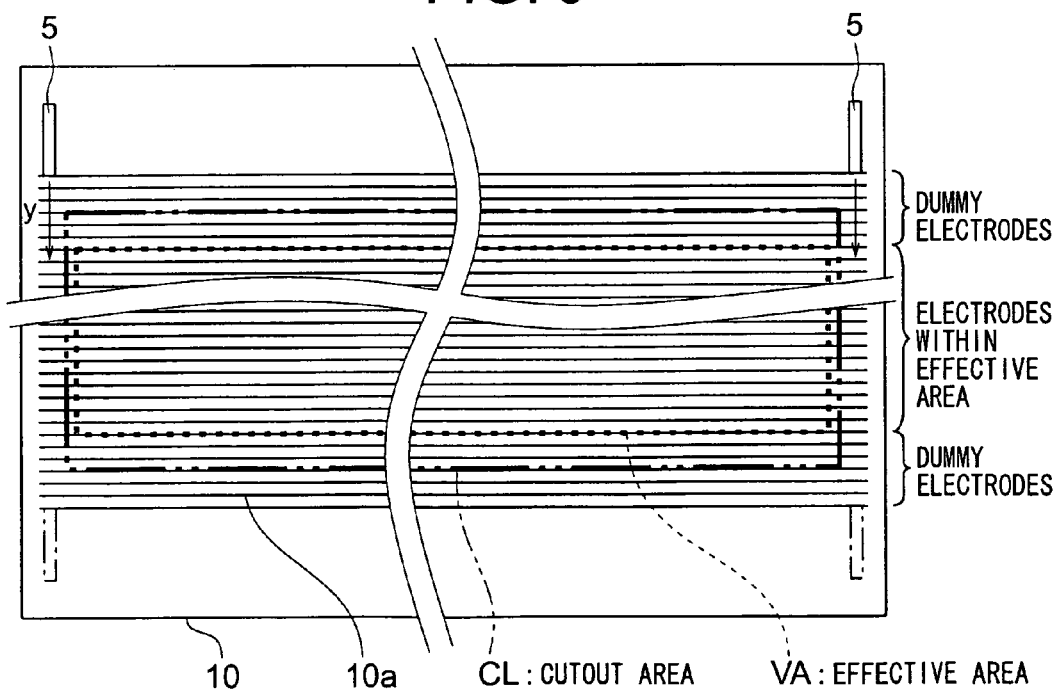
FIG. 9 is a view showing another example of the relationship between the electrode patterns of the target substrate and the contact member in an embodiment of the present invention.

FIG. 9 is a view showing, similarly to FIG. 8, the positional relationship between the electrode patterns of the target substrate and the contact members in an embodiment of the present invention described above. However, in this case, the effective area VA and the cutout area CL as a panel to be manufactured are different from those shown in FIG. 8, that is, the effective area VA is set inside, by substantially the length in the traveling direction of the contact member 5, the target substrate 10 on both upper and lower sides thereof. The panel having such setting can be provided for a display device with avoiding porous nonuniformity near the upper and lower sides of the target substrate 10 which can occur in a specific case.

Hereinafter, the porous nonuniformity near the upper and lower sides of the target substrate 10 which occurs in a specific case will be described. As described above, the current value to each electrode pattern 10a becomes equal by controlling the treatment current in accordance with the number of the electrode patterns 10a in contact with the contact members 5, whereby the pore formation at each part on the target substrate 10 is made uniform. This exhibits prominent effects but, in more detailed investigation, for example, in the case such as a polycrystalline silicon layer before the pore formation having a small thickness, the following relatively small nonuniformity occurs.

Specifically, as shown in FIG. 9, as the contact members 5 are moved from the initial state, when the contact members 5 are in contact with only one electrode pattern 10a, the polycrystalline silicon layer is selectively made porous near the electrode pattern 10a. Then, the number of the electrode patterns 10a in contact is increased to two, the driving current by the current source doubles (see FIG. 4A and FIG. 4B), in which a stronger electric field occurs at a part near the first electrode pattern 10a where the pore formation has already proceeded because the original (non-reacted) polycrystalline silicon layer is thin. In other words, the magnitudes of electric current are different between a part near the first electrode pattern 10a and a part near the second electrode pattern 10a, and thereafter the pore formation also proceeds faster at the part near the first electrode pattern 10a.

Similarly, in the process of increase in the number of the electrode patterns 10a in contact, at the part where the pore formation has already proceeded further, more current passes therethrough and therefore the pore formation proceeds further. Once the number of the electrode patterns 10a in contact becomes fixed, occurrence of such a phenomenon itself stays unchanged, but the total degree of pore formation at each part becomes invariable because of integration in terms of time. On the other hand, in the process of decrease in the number of the electrode patterns 10a in contact as the movement of the contact members 5 gets closer to the final state, the result becomes opposite to that in the process of increase in the number of the electrode patterns 10a in contact, that is, at the part closer to the last electrode pattern 10a, the degree of the pore formation is smaller than that perceived from appearance of control of the current source.

Consequently, in the case of a polycrystalline silicon layer having a small thickness before pore formation, the pore formation proceeds further at a part near the beginning of the movement of the contact members 5 and the pore formation is more greatly restrained at a part near the end of the movement. Hence, by setting the effective area VA and the cutout area CL as shown in FIG. 9, the target substrate can be provided for manufacturing the display device with the relatively small nonuniformity avoided. In other words, a display device having less variation in display can be obtained. It should be noted that in this case electrode patterns lying outside the effective area VA are placed as dummy electrodes.

Figure 10:
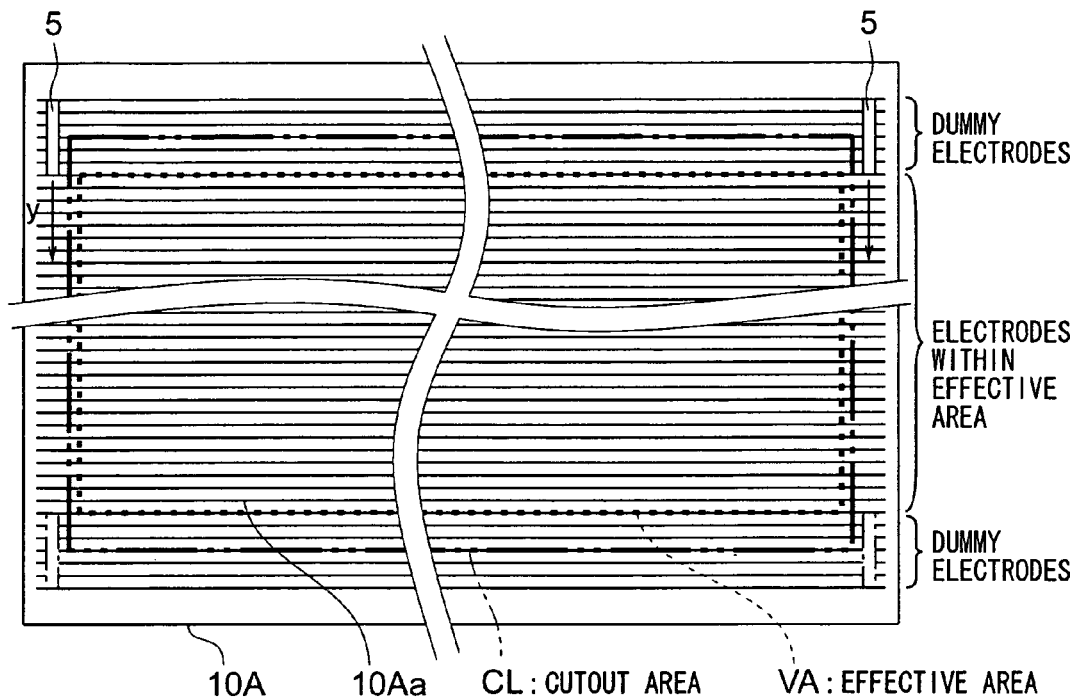
FIG. 10 is a view showing still another example of the positional relationship between the electrode patterns of the target substrate and the contact member shown in FIG. 8.

FIG. 10 is a view showing still another example of the positional relationship between the electrode patterns of the target substrate and the contact members shown in FIG. 8. More specifically, in the example shown in FIG. 10, anodic oxidation treatment is performed using the target substrate 10A provided with dummy electrodes outside the effective area shown in FIG. 8. In other words, a target substrate 10A formed with electrode patterns 10Aa including the dummy electrodes is used. If such a target substrate 10A is used, it is not necessary to perform current control to exhibit the profile in the form of the isosceles trapezoid as shown in FIG. 4A and FIG. 4B or in a form similar to that. This is because the number of the electrode patterns 10Aa in contact is substantially the same. (although there is increase/decrease by one) when the contact members 5 are placed at any position.

However, the part of the target substrate 10A where the pore formation is uniformly performed is inside the dummy electrodes on both sides (that is, the part corresponding to electrodes within the effective area). This is because the contact time of the electrode pattern of the dummy electrode with the contact members 5 is shorter than that of the electrode within the effective area and therefore the cumulative amount of charges to be injected is smaller at a part with the dummy electrode. Also in this case, the area to be cut out and used for a display device is a part where the pore formation is uniformly performed and a cutout area CL extending outside the part.

Figure 11:
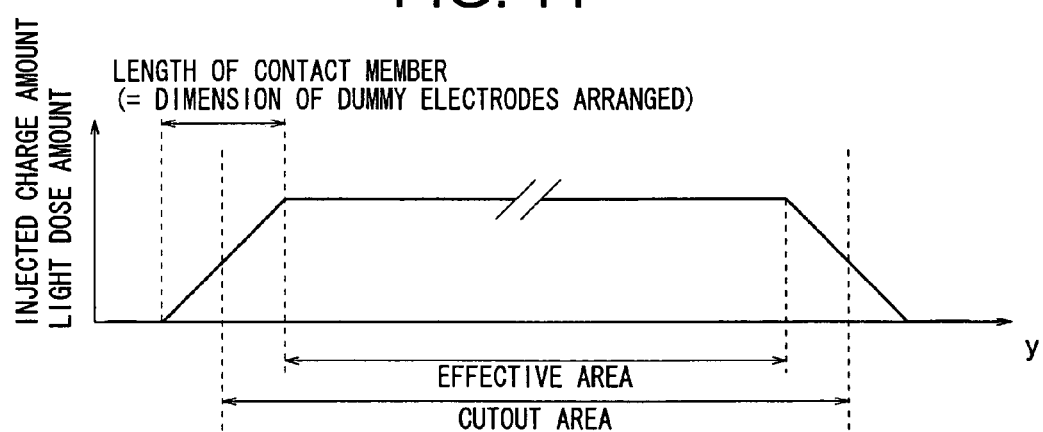
FIG. 11 is a diagram showing a light dose amount and an injected charge amount in the target substrate shown in FIG. 10.

Then, the injected charge amount (it can be observed as a light dose amount) in a y-direction (in a vertical direction in the drawing) of the target substrate 10A shown in FIG. 10 is represented as shown in FIG. 11. FIG. 11 is a diagram showing the injected charge amount (the light dose amount) in the target substrate 10A shown in FIG. 10. More specifically, the profile in the y-direction of the injected charge amount (the light dose amount) exhibits a form of an isosceles trapezoid, and the length in the y-direction corresponding to its hypotenuse part corresponds to the length in the traveling direction of the contact member 5. Further, the length in the y-direction of a part corresponding to an upper base corresponds to an effective area VA as a display device, and parts extending out toward both sides to surround the effective area VA become cutout areas CL.

In short, a panel for a display device manufactured in this embodiment is formed such that parts where the degree of pore formation is lower than that of a part sandwiched therebetween are formed near the upper and lower sides of the substrate. It is similar to the preceding embodiments that the electric current required for anodic oxidation treatment can be reduced, whereby a large target substrate can be treated by a small component (specifically the small current source 32) also in this embodiment. Furthermore, it is also similar that since the area on the target substrate 10A through which electric current is passed at a time is reduced, improved uniformity in electric current over the target substrate 10A can be expected, thereby enabling increased uniformity in anodic oxidation. Moreover, the configurations shown in FIG. 5, FIG. 6, FIG. 7A and FIG. 7B are applicable unchanged.

Although the case of anodic oxidation in which light irradiation is performed is taken as an example in the above description for each embodiment, the effect of reduction in size of components can be similarly obtained even in anodic oxidation treatment in which no light irradiation is performed.

As has been described in detail, according to the present invention, passage of electric current for anodic oxidation is performed for the target substrate on a part-by-part basis by the contact members moving along the sides of the target substrate. Accordingly, the electric current required for the treatment can be reduced, whereby a large substrate can be treated by a small component.

What is claimed is:

1. An anodic oxidation apparatus, comprising:
a lamp which emits light;
a treatment bath which has a stage capable of mounting a target substrate thereon with a treatment part thereof directed upward and provided at a position where the emitted light reaches and a frame located on the stage;
a cathode electrode which is provided on the way of the emitted light to reach the mounted target substrate and includes an opening to allow the light to pass therethrough;
a seal member which establishes a liquid sealing property between the frame and the mounted target substrate;
a conductive contact member which is provided to be contactable with a plurality of electrode patterns formed substantially in parallel on the target substrate outside an annular shape of said seal member and moves perpendicular to the electrode patterns along side of the mounted target substrate continuously, the conductive contact member having a longer length to contact with the electrode patterns in a direction of movement than an interval of the electrode patterns; and
a current source which is electrically connected to said contact member and sets an output current value in accordance with the number of electrode patterns of the mounted target substrate in contact as said contact member moves.

2. The anodic oxidation apparatus as set forth in claim 1, wherein the length of said contact member to be provided for contact with the electrode patterns of the target substrate in the direction of the movement thereof ranges from 10 mm to 200 mm.

3. The anodic oxidation apparatus as set forth in claim 1, wherein said contact member moves while in contact with the electrode patterns of the target substrate by sliding thereon.

4. The anodic oxidation apparatus as set forth in claim 1, wherein said contact member moves while in contact with the electrode patterns of the target substrate by rolling thereon.

5. The anodic oxidation apparatus as set forth in claim 1, further comprising:
a moving/scanning part which moves said lamp and said cathode electrode in synchronism with the movement of said contact member.

6. The anodic oxidation apparatus as set forth in claim 1, wherein said current source outputs electric current proportional to the number of electrode patterns of the target substrate which are in contact with said contact member.

7. The anodic oxidation apparatus as set forth in claim 1, further comprising:
a contact member moving/scanning part which moves said contact member at a fixed speed.

* * * * *

UNITED STATES PATENT AND TRADEMARK OFFICE
CERTIFICATE OF CORRECTION

PATENT NO. : 7,569,124 B2  Page 1 of 1
APPLICATION NO. : 10/924830
DATED : August 4, 2009
INVENTOR(S) : Yagi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1356 days.

Signed and Sealed this

Fourteenth Day of December, 2010

David J. Kappos
*Director of the United States Patent and Trademark Office*